(12) United States Patent
Korman et al.

(10) Patent No.: US 7,642,449 B2
(45) Date of Patent: Jan. 5, 2010

(54) PHOTOVOLTAIC INTEGRATED BUILDING COMPONENT

(75) Inventors: Charles Steven Korman, Niskayuna, NY (US); Richard Alfred Beaupre, Pittsfield, MA (US); Neil Anthony Johnson, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 791 days.

(21) Appl. No.: 10/711,107

(22) Filed: Aug. 24, 2004

(65) Prior Publication Data

US 2006/0042680 A1   Mar. 2, 2006

(51) Int. Cl.
*H01L 31/00* (2006.01)
(52) U.S. Cl. ............... 136/244; 136/256; 52/173.3
(58) Field of Classification Search ........... 136/246, 136/251, 244, 256; 52/173.3
See application file for complete search history.

(56) References Cited

U.S. PATENT DOCUMENTS

| | | | | |
|---|---|---|---|---|
| 3,985,116 A | * | 10/1976 | Kapany | ............... 126/687 |
| 4,273,106 A | * | 6/1981 | Gould | ............... 126/622 |
| 5,008,062 A | * | 4/1991 | Anderson et al. | ...... 264/272.15 |
| 5,250,265 A | * | 10/1993 | Kawaguchi et al. | ......... 422/107 |
| 5,480,494 A | * | 1/1996 | Inoue | ............... 136/251 |
| 5,990,414 A | | 11/1999 | Posnansky | ............... 136/244 |
| 6,179,639 B1 | * | 1/2001 | Kuwahara et al. | ........... 439/282 |
| 6,215,060 B1 | * | 4/2001 | Komori et al. | ............ 136/251 |
| 6,630,622 B2 | * | 10/2003 | Konold | ............... 136/246 |
| 2003/0034062 A1 | * | 2/2003 | Stern et al. | ............... 136/244 |
| 2003/0160243 A1 | * | 8/2003 | Middelman et al. | ........... 257/72 |
| 2004/0000334 A1 | | 1/2004 | Ressler | ............... 136/251 |
| 2004/0011354 A1 | | 1/2004 | Erling | ............... 126/621 |
| 2004/0031219 A1 | | 2/2004 | Banister | ............... 52/220.2 |
| 2004/0089339 A1 | * | 5/2004 | Kukulka et al. | ............ 136/251 |

\* cited by examiner

*Primary Examiner*—Alex Noguerola
(74) *Attorney, Agent, or Firm*—Ann M. Agosti

(57) ABSTRACT

A structural building component for a residential or light commercial building includes a PV laminate and a plastic frame disposed at least around the PV laminate. The plastic frame includes a first electrical connector for communication with the PV laminate and receptive to electrical connection with a contiguous PV laminate. The first electrical connector is configured to facilitate electrical and mechanical connection with the contiguous PV laminate and the frame includes a means for facilitating attachment to the building structure.

28 Claims, 5 Drawing Sheets

Snap in Connectors

PHOTOVOLTAIC INTEGRATED BUILDING COMPONENT

BACKGROUND OF THE INVENTION

Providing electricity through photovoltaic cells is becoming more popular as this technology has decreased in cost and reliance on other sources of electric power is increasingly disfavored for environmental and strategic reasons. However, providing a general use tile with electrical components that is easy to install and electrically connectable to other tiles without external wiring has been elusive.

Photovoltaics refer to cells that convert sunlight directly into electrical energy. The electricity produced is direct current that can be used as direct current, converted to alternating current through the use of an inverter, or stored for later use in a battery. Conceptually, in its simplest form, a photovoltaic device is a solar-powered battery whose only consumable is light. Because sunlight is universally available, photovoltaic devices have many advantages over traditional power sources. Photovoltaic systems are modular, and so their electrical power output can be engineered for virtually any application. Moreover, incremental power additions are easily accommodated in photovoltaic systems, unlike more conventional approaches such as fossil or nuclear fuel, which require multi-megawatt plants to be economically feasible.

Although photovoltaic cells come in a variety of forms, the most common structure is a semiconductor material into which a large-area diode, or p-n junction, has been formed. In terms of basic function, electrical current is taken from the device through a contact structure on the front that allows the sunlight to enter the solar cell and a contact on the back that completes the circuit.

In the field of solar PV modules, proposals have been made to form the PV module having the general characteristics of a roofing tile so that the PV laminate may be integrated into a roof, commonly but not exclusively, a tile roof. An alternative approach is to have a module which is adapted to be mounted over a roof. However, important considerations to the design and development of PV modules include the ability of the modules to be effectively integrated architecturally into a roof design.

Traditionally a photovoltaic (PV) module is mounted onto a finished rooftop, e.g. a rooftop already covered with shingles or tiles. Installation usually requires the addition of brackets or other devices to which the modules are affixed that require a number of rooftop penetrations to provide anchoring. In some cases existing rooftop material is removed or reinstalled to accommodate the installation. This installation represents additional cost, and in many cases, substantial cost due to the special nature of the installation and the requirement for specially trained installers. Installation can represent 25-30% of the total installed system cost which limits widespread economic viability of PV in the residential and light commercial markets today. In addition to the high cost of installation, PV installation adversely affects the appearance of a rooftop since the "look and feel" of traditional PV modules with metal frames and glass surfaces is discontinuous with other roofing materials. Aesthetics is critical to home builders and home buyers alike.

There have been several attempts to define the PV module as an integrated building material. Most notably, an a-Si on stainless steel product has been promoted as an integrated photovoltaic solution. However, this product has had limited growth due to the use of a plastic coating instead of glass and the overall low efficiency and high cost/Watt of the product.

There have also been attempts to laminate thin film and Monocrystalline Si PV onto various types of tiles that are then used as roofing materials. These products have not succeeded in the marketplace for several reasons including high cost and the large numbers of interconnections needed. Most recently, a product has been designed to replace concrete tiles. Although the form factor and method of installation is consistent with a concrete roofing tile, it still uses a metal frame. While this product looks more aesthetically pleasing than traditional modules and has made some inroads with builders, it still requires specially trained installers and is limited to replacing concrete tiles. No one has come up with a blend of photovoltaics and roofing material that can meet the necessary cost, and material compatibility.

Accordingly, there is still a need for a photovoltaic solar roof or solar facade that does not require special roofing preparation and doesn't impact roofing stability. Furthermore, it is desired that the laying and repair of a solar roof or solar facade may be undertaken, without the expenditure of further cost, and simple to install by normal building trades requiring only a minimum of special training.

BRIEF DESCRIPTION OF THE INVENTION

A structural building component for a residential or light commercial building is disclosed. The building component includes a PV laminate and a plastic frame disposed at least around the PV laminate. The plastic frame integrates an electrical connector that interfaces with the electrical backplane of the laminate and includes a first electrical connector for communication with the PV laminate and receptive to electrical connection with a contiguous PV laminate. The first electrical connector is configured to facilitate electrical and mechanical connection with the contiguous PV laminate and the frame includes a means for facilitating attachment to the building structure.

In another embodiment, a method for forming an integrated PV laminate and frame for a structural building component is disclosed. The method includes molding a first electrical connector in a plastic frame for communication with a PV laminate and receptive to electrical connection with a contiguous PV laminate; molding a heat sink in the frame in thermal communication with the first electrical connector; molding a snap-fit feature in the frame for interconnection with the contiguous PV tile; configuring a means for facilitating attachment to the building structure in the frame; and combining the frame with the PV laminate.

Other systems and/or methods according to the embodiments will be or become apparent to one with skill in the art upon review of the following drawings and detailed description. It is intended that at all such additional systems and methods be within the scope of the present invention, and be protected by the accompanying claims.

DETAILED DESCRIPTION OF THE INVENTION

The present invention relates generally to framing systems and more particularly is concerned with systems adapted to mount panel members or laminates in an array on a supporting structure. The present invention will be exemplified with particular application to the field of mounting solar panels, also known as photovoltaic (PV) panels which are adapted to be mounted suitably at an angle to the horizontal and receptive to incident light with respect to the sun. However, the invention and the framing system is not necessarily limited to just these applications and extends to analogous applications. In this discussion we refer to use of the described system as mainly in roof mounting or roof integrating applications. However the system described can equally be suitable, with minor adjustments, for use in a vertical arrangement as an external PV wall cladding system.

Figure 1:
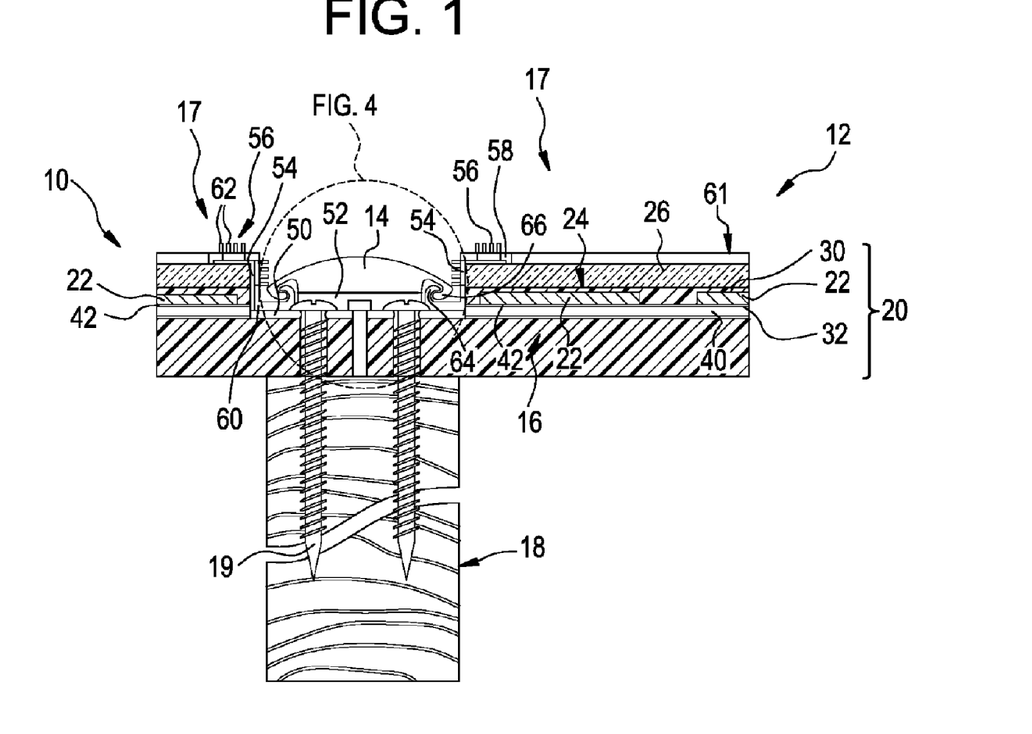
FIG. 1 is a cross section view of two PV laminate assemblies operably coupled to one another via a sealing member and operably attached to a rafter of a building structure in accordance with an exemplary embodiment.

Referring now to FIG. 1, two solar cell or PV laminate assemblies 10 and 12 are operably coupled to one another via a sealing member 14. The sealing member 14 integrates at least one of electrical features, mechanical features, and weatherproof features that simplify installation and interconnection of PV laminate assemblies 10 and 12 discussed more fully hereinbelow. PV assemblies 10 and 12 are each disposed on a corresponding polymer substrate 16 in place of a plywood sheathing. The polymer substrate 16 is in turn attached to a rafter 18 of a building structure (not shown), such as a roof, for example. In an exemplary embodiment, polymer substrate 16 is a thermoplastic composite such as AZDEL Superlite®, for example, however, other thermoplastic composites are envisioned. AZDEL Superlite® is a product of the assignee of the present application and is a low pressure, thermoformable, composite of a thermoplastic resin matrix and long chopped fibers combined with outer layers as needed for the application. (e.g., adhesion film, barrier film, scrim, tough PP film, non-woven, reinforcement or just the bare surface.) AZDEL® products are polypropylene-based and generally used for their unique balance of excellent structural properties including strength, stiffness and impact resistance. In this manner, AZDEL® can be integrated with each laminate assembly 10 and 12 and be substituted for plywood sheathing for direct installation to a building rafter 18 thus acting as a structural component in addition to a power generating component. As shown in FIG. 1, polymer substrate 16 extends on all sides beyond the active solar area 17 of the laminate assemblies 10, 12 to allow fastening to rafter 18 using roofing screws 19. However, laminate assemblies 10, 12 may not necessarily be installed directly to a rafter, as other embodiments are contemplated, one of which includes the direct attachment to a rafter. In this case, interconnected laminate assemblies 10, 12 need to be watertight and be fire rated. Attachment of laminate assemblies 10, 12 mounted above a fire rated and weatherproof sheathing material is much simpler. The composite substrate in either case can integrate the electrical connector and other features that simplify mounting and provide cooling channels, for example.

Each solar cell laminate assembly 10 and 12 includes a backplane assembly 20 having a plurality of solar cell assemblies or silicon wafers 22 mounted thereto and encapsulated with an encapsulant 24. A glass substrate 26 is disposed over the encapsulant 24 to allow sunlight therethrough. When an exposed surface or a first side 30 of each silicon wafer 22 receives photons through the glass/encapsulant interface, silicon wafer 22 produces an electrical current on a second opposite side 32, as is well known in the art.

The plurality of solar cell assemblies 22 are electrically coupled together via backplane assembly 20. The number of solar cell assemblies is not intended to be limited, the number and configuration of which will depend on the intended application. For exemplary purposes, solar cell assemblies 22 are illustrated. The design of the various solar cell assemblies are substantially the same and electrically coupled to one another in a similar manner.

In either case and still referring to FIG. 1, backplane assembly 20 includes an insulating substrate 40 with a metal layer 42 intermediate silicon wafers 22 and substrate 40 in an exemplary embodiment. Insulating substrate 40 is a polymeric substrate including a flexible or a rigid polymer. Substrate 40 as shown is a flexible polymer while metal layer 42 is deposited thereon as electrical interconnects for electrical connection with silicon wafers 22. It will be noted that a polymer based backplane can be laminated to the composite substrate 40 or the solar cells can be directly bonded to a metal foil that is laminated to the composite substrate 40.

Metal layer 42 includes copper or aluminum, or another metal selected on a combined basis of cost, electrical, and thermal performance. Metal layer 42 is patterned to match an interconnection configuration between silicon wafers 22 and contiguous module laminate assemblies 10, 12. A number of techniques can be used to form the interconnection pattern on metal layer 42 including, but not limited to, deposition of electrical interconnects on a polymer flex, for example.

The solar cells or silicon wafers 22 are disposed on the metal layer 42 using a conductive epoxy or a solder (not shown). The metal layer 42 should provide a low resistance interconnection both electrically and thermally between cells 22. More specifically, metal layer 42 is effective as a thermal sink for heat generated by the cells 22 in conversion of the solar energy to electrical energy or the heat from the absorbed solar radiation in the laminate assembly 10, 12.

Figure 2:
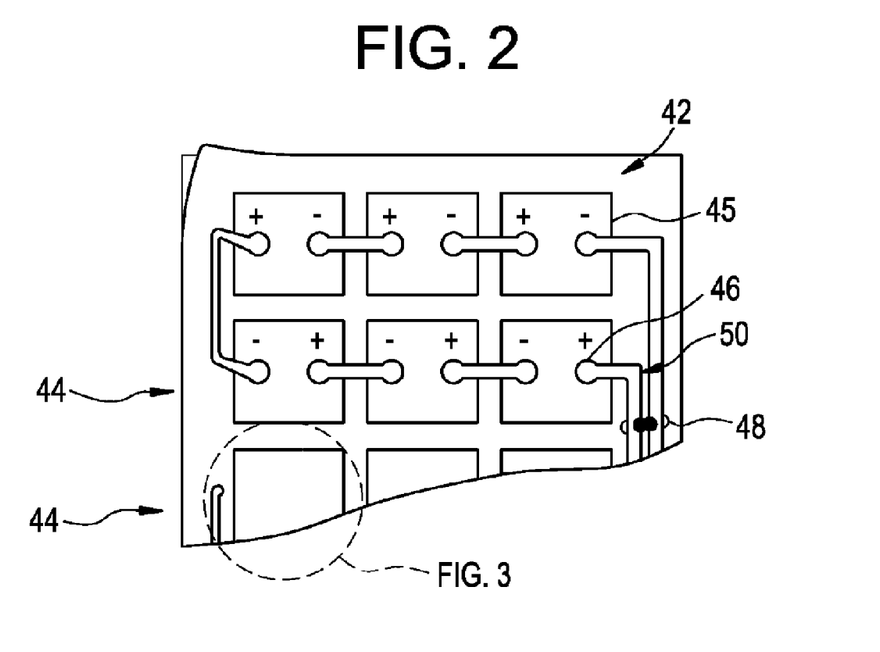
FIG. 2 is a top plan view of a substrate of FIG. 1 detailing an electrical interconnection pattern between individual solar cells and an electrical bus disposed on an edge of the assembly in accordance with an exemplary embodiment.

Referring now to FIG. 2, metal layer 42 is patterned on polymer flex substrate 40 to segment the electrical interconnection of cells 22 such that the cells 22 can be grouped in a number of ways to provide fault tolerance. FIG. 2 shows a number of cells 22 connected in series and a number of wafer locations 45 illustrating an interconnect pattern 46 in such a series string 44. Each series string 44 may include a diode 48 that allows a failed string 44 to be bypassed.

Figure 3:
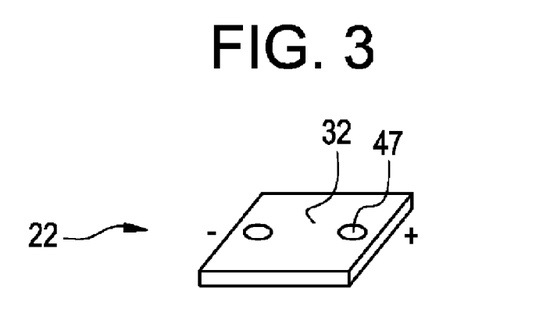
FIG. 3 is a bottom perspective view of a silicon wafer of FIG. 2 removed illustrating electrical contacts disposed on a bottom surface thereof for connection with the corresponding contacts of the interconnection pattern in accordance with an exemplary embodiment.

FIG. 3 illustrates a backside or second side 32 of a wafer 22 in a series string 44 of FIG. 2. As shown in FIGS. 2 and 3, the current from the segments is transported from corresponding pads 47 on a second side 32 of each cell 22 in a series string 44 and combined at an edge connector 50 of the metal layer 42 corresponding to an edge of the laminate. FIG. 2 also illustrates how diodes 48 that may be used to bypass failed segments are mounted to layer 42.

As is well known in the art, when all cells 22 in an array are illuminated, each cell will be forward biased. However, if one or more of the cells is shadowed (i.e., not illuminated), by an obstruction or the like, the shadowed cell or cells may become reversed biased because of the voltage generated by the unshadowed cells. Reverse biasing of a cell can cause permanent degradation in cell performance or even complete cell failure. To guard against such damage, it is customary to provide protective bypass diodes. One bypass diode 48 may be connected across several cells, or for enhanced reliability, may be integral with a corresponding edge connector 50.

Referring again to FIG. 1, the heat generated by the photo-electro conversion of cells 22 or by absorbed solar radiation internal to the laminate assemblies 10, 12, is also channeled to the edge connector 50 of the laminate where it can be dissipated by radiation or convection discussed more fully below.

Figure 4:
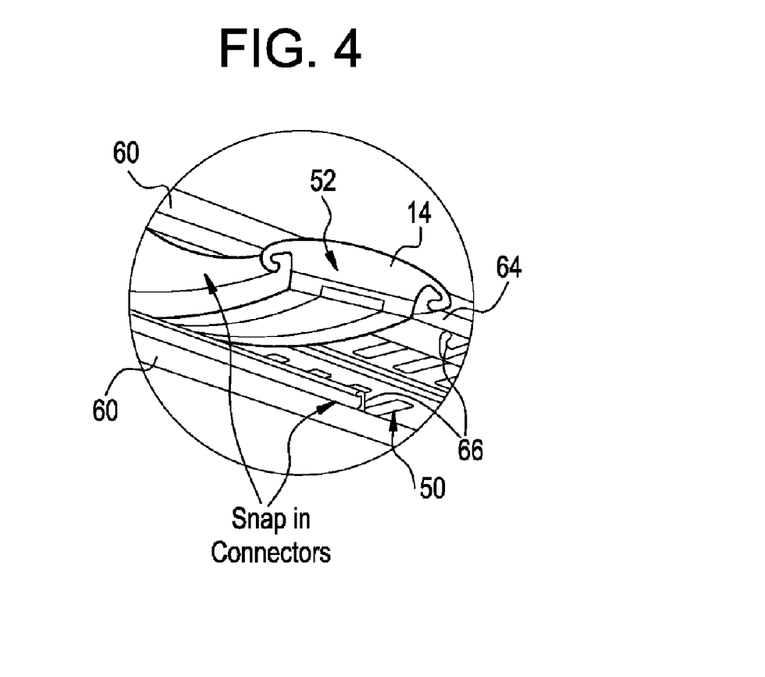
FIG. 4 is enlarged portion of FIG. 1 illustrating the mechanical and electrical connections of the sealing member in accordance with an exemplary embodiment.

FIGS. 1 and 4 illustrate one possible embodiment where contiguous edge connectors 50 from respective laminate assemblies 10 and 12 are operably connected to one another via a second electrical connector 52 integrated or disposed with sealing member 14 to provide electrical interconnection therebetween. Each edge connector 50 includes a conductive extension 54 extending therefrom that extends normal to substrate 40 outside and along respective laminate assemblies 10, 12 to a heat sink assembly 56 providing a means to radiate or convectively dissipate heat at respective edges defining each assembly 10, 12.

It should be noted that heat sink assembly may include a high emissivity surface or layer 58 that is molded in frame 60 and is thermally connected to conductive extension 54. The high emissivity surface 58 may be provided to absorb a portion of energy of photons contacting layer substrate 40 and to radiate the absorbed energy away from solar cell 22. By radiating the absorbed energy, solar cell 22 can be maintained with an optimal temperature range. In an exemplary embodiment, a plastic frame 60 surrounds each assembly 10 and 12. FIG. 1 shows plastic frame 60 disposed around a periphery of each laminate assembly and a line of frame beyond generally at 61. Each plastic frame 60 is either injection molded around a completed PV laminate or separately molded before integrating with the completed PV laminate assembly 10, 12. Alternatively, plastic frame 60 may be integral with composite substrate 40. Each plastic frame 60 includes a corresponding heat sink assembly 56 embedded therewith in thermal communication with a respective conductive extension 54. In one embodiment, each heat sink assembly 56 includes cooling fins 62 insert molded with frame 60. It will be recognized that frame 60 can be an integral component of the laminate itself.

Still referring to FIGS. 1 and 4, sealing member 14 is configured to be operably connected with two adjacent assemblies via a snap-fit feature 64 on either side of the sealing member 14 configured to engage a mating snap-fit feature 66 extending from an edge of the plastic frame 60. As illustrated, engagement between snap-fit features 64 and 66 provides a sealed interface 68 to protect a corresponding edge connector 50, thus sealing connector 50 from exposure to outside elements. Furthermore, sealing member 14 is an elastomeric member providing an elastomeric seal configured to accommodate sealing between the plastic frame 60 and corresponding PV laminate assembly 10, 12.

Sealing member 14 may be configured without second electrical connector 52 when wires extend from PV laminate assemblies 10 and 12. In this case, sealing member 14 may provide a cavity for disposing wires electrically connected therein.

Figure 9:
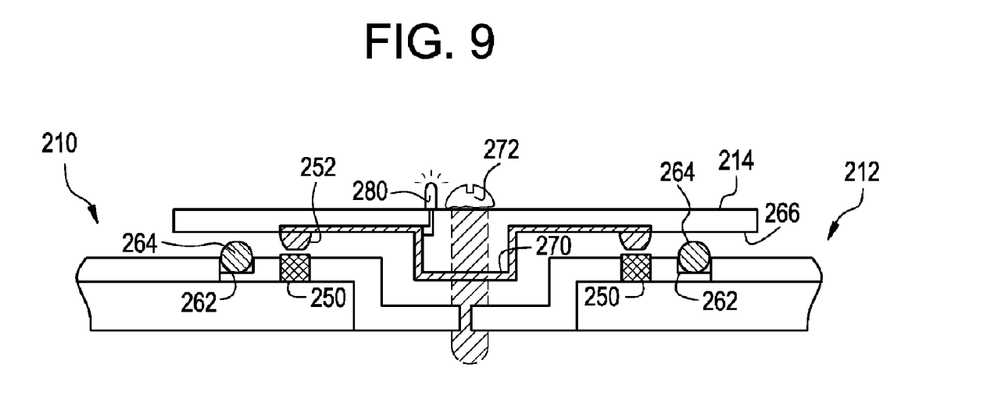
FIG. 9 is a cross section view of two PV laminate assemblies operably coupled to one another via a sealing member and operably sealed against the elements in accordance with an alternative exemplary embodiment.

Referring now to FIG. 9, an alternative embodiment of sealing member 214 and contiguous PV laminate assemblies 210 and 212 are illustrated. Sealing member 214 is configured as a "T" to form a substantially flush or seamless assembly of assembled PV laminate assemblies 210, 212. Each laminate assembly 210, 212 includes a corresponding frame 260 having a channel 262 receptive to an O-ring 264 to form a seal with a bottom surface 266 of sealing member 214. Each laminate assembly 210, 212 further includes a corresponding female electrical connector 250 for connection with a corresponding male electrical connector 252 extending from sealing member 214. Male electrical connectors 252 in turn are connected to an electrical buswork 270 providing a conduit for generated power from the solar cells. Sealing member 214 is biased towards laminate assemblies 210, 212 with respective O-rings 264 therebetween with a mechanical fastener 272 to complete a seal therebetween. A light emitting diode 280 (shown in phantom) is optionally included for indication that electrical connection between sealing member 214 and each laminate assembly 210, 212 is completed. This diode may be mounted with the sealing member or corresponding laminate assembly 210, 212 indicative of a completed circuit or to verify continuity therebetween. Although male and female electrical connectors 252 and 250, respectively, have been described, any suitable electrical connector is contemplated suitable to the desired end purpose.

Figure 5:
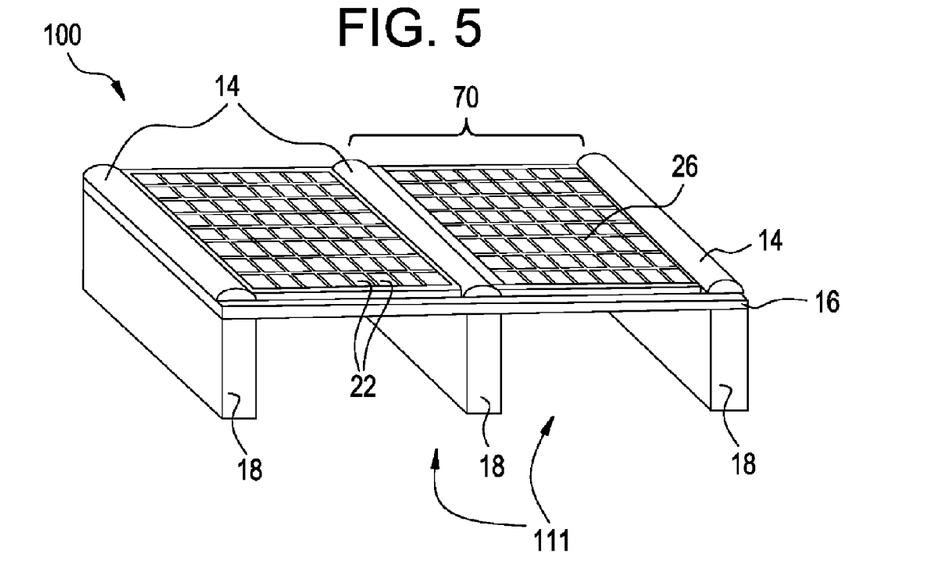
FIG. 5 is a perspective view of the two PV laminate assemblies of FIG. 1 attached to three rafters in accordance with an exemplary embodiment.
Figure 6:
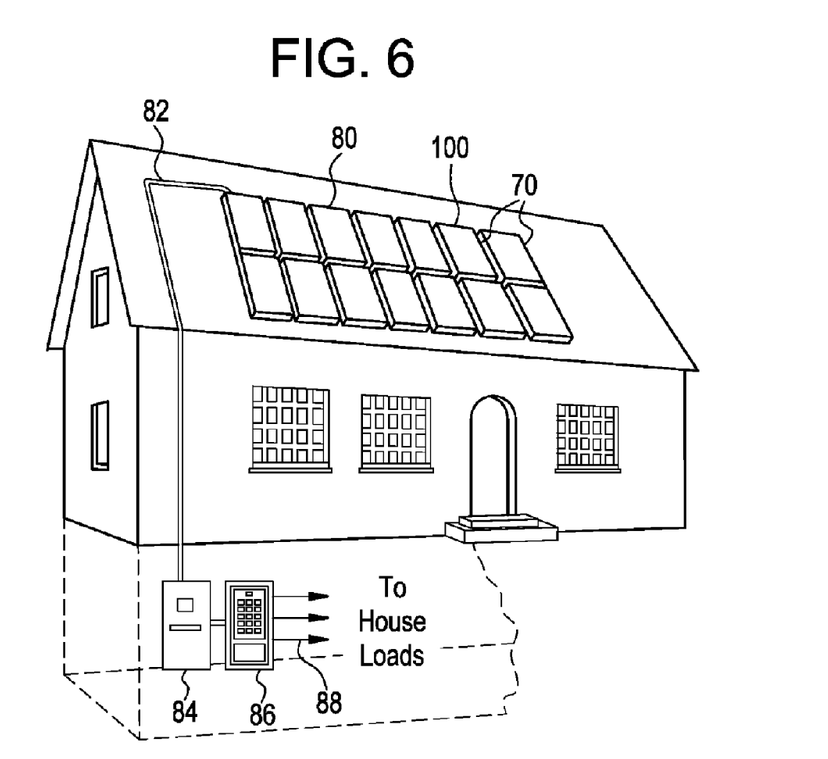
FIG. 6 is a perspective view of a PV module array integrated with a residential rooftop illustrating electrical connection to an electrical panelboard in accordance with an exemplary embodiment of the present invention.

FIG. 5 illustrates a pair of PV laminate modules 70 of a rooftop array 100 illustrated in FIG. 6 joined together and mounted to three rafters 18 separated by 16 or 24 inches on center (O.C.). It will be noted that skylights and water heating panels, having a similar look and feel as the PV laminate modules 70, can be inserted into the rooftop array 100. Further, it will be noted that the polymer construction of these modules 70 allow them to integrate seamlessly with other plastic roofing products.

FIG. 6 illustrates the rooftop array 100 in electrical communication with a main electrical bus 80 at a top of the array 100 which is in turn operably connected to a single electrical cable 82 leading to an inverter 84. Inverter 84 receives the direct current (DC) produced by array 10 and generates an alternating current (AC) to an electrical panel 86. Panel 86 in turn feeds the generated AC to house loads generally shown at 88.

Figure 7:
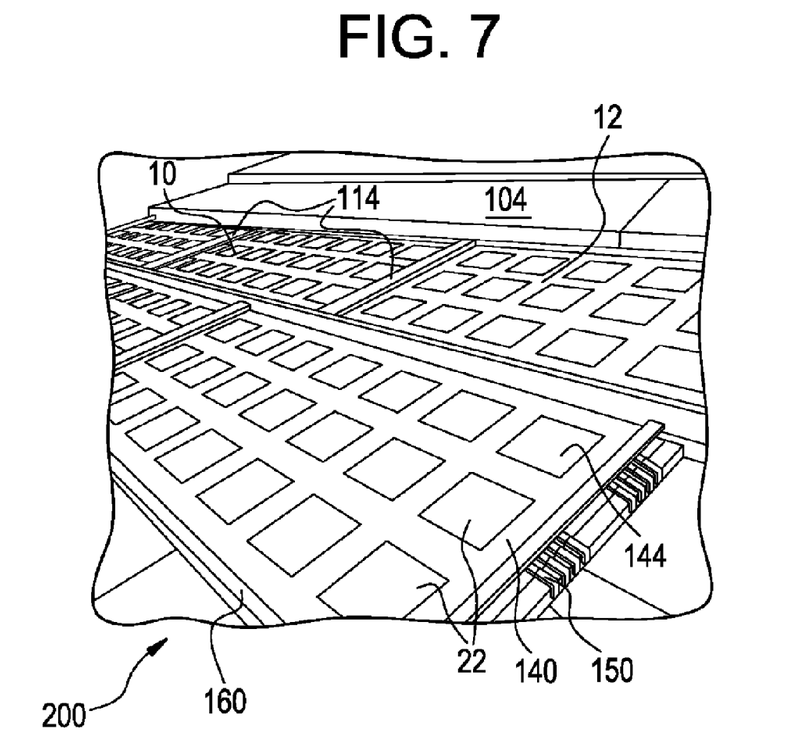
FIG. 7 is a perspective view of a PV rooftop array integrated with roof tiles mounted to roof rafters via battens normal to the rafters in accordance with another exemplary embodiment.
Figure 8:
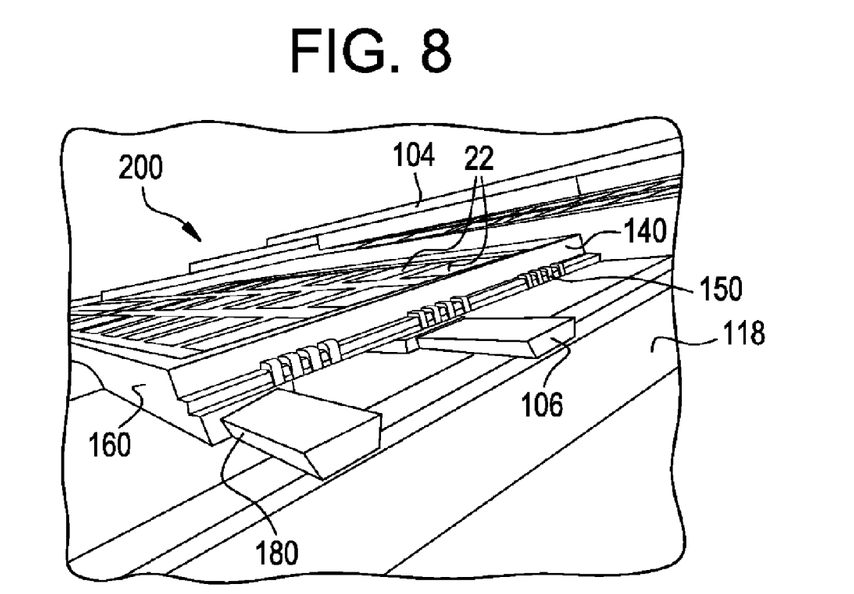
FIG. 8 is another perspective view of the PV rooftop array of FIG. 7 illustrating a frame of each PV tile having keyed channels to facilitate assembly with the battens in accordance with another exemplary embodiment.

FIGS. 7 and 8 illustrate an alternative exemplary embodiment of a PV rooftop array 200 integrated with roof tiles 104 mounted to roof rafters 118 via battens 106 normal to rafters 118. Rooftop array 200 includes a plurality of PV laminate assemblies 10 and 12 sealed together with a sealing member 114. Each PV laminate assembly 10, 12 includes a plurality of PV cells 22 disposed on a corresponding substrate 140 and is surrounded by a frame 160. Each segment 144 of each assembly 10, 12 includes a corresponding edge connector 150 exposed for connection with a contiguous connector 150 via a conductor (not shown) integrated with sealing member 114. Frame 160 includes a means for facilitating attachment to a building structure including a keyed channel 180 configured on a mounting side of the plastic frame 160 receptive to a complementary configured batten 106. For example, keyed channel 180 and batten 106 extending therethrough include a dovetail configuration to retain the PV tile with respect to the batten 106.

In exemplary embodiments, selection of plastic material include matching the plastic material of the frames 60 and 160 with the PV laminate so that the integrated structure is stable across all operating temperatures. It will be recognized by one skilled in the pertinent art that matching a coefficient of thermal expansion of the laminate with the frame may require that more than one plastic material be used (e.g., multi-component plastic frame).

Furthermore, it is envisioned that glass as opposed to plastic be used as the top exposed surface of the completed roofing tiles since glass continues to offer the best mix of mechanical and optical properties over a 20-30 year product life. However, it is contemplated to forgo the glass and directly mold a transparent plastic cover directly over the solar cells. The nature of the laminate in this case will most likely be a very thin plastic encapsulant that is also used to seal the laminate and provide mechanical compliance. The molded plastic cover will provide mechanical strength and also significantly reduce tile weight compare to using glass.

Referring now to FIGS. 5 and 8, each PV tile optionally includes the ability to remove heat from underneath the tile into a ventilation space generally shown at 111 in FIG. 5. For example, if the tile is to be directly mounted onto the rafters as in FIG. 5, the heat can be rejected into the ventilation space of the house with the possibility of including a ventilation fan in the attic or crawl space. If the tile is mounted over plywood/sheathing as in FIG. 8, the ventilation space can be created by slots (not shown) formed in the frame 160.

Flexible substrate 40 can be constructed from a thermally non-conductive polyimide identified by the trademark "KAPTON H" or the trademark "KAPTON E", manufactured by DuPont Corporation. Because the KAPTON® product is a thermally non-conductive polyimide, the inventors herein have recognized that the heat radiating layers can be disposed through the KAPTON® layer 40 to radiate excess heat generated in solar cell 22, and the other solar cells in the solar cell array from a backside of solar cell array. In an exemplary embodiment, heat is removed by using the metallization as a heat spreader, since Kapton is non thermally conductive and thermally conductive polymers tend to be expensive thus prohibiting practical use thereof.

In alternate embodiments, substrate 40 can be constructed from films of one or more of the following materials: (i) polyethyleneterephthalate ("PET"), (ii) polyacrylates, (iii) polycarbonate, (iv) silicone, (v) epoxy resins, (vi) silicone-functionalized epoxy resins, (vii) polyester such as polyester identified by the trademark "MYLAR" manufactured by E.I. du Pont de Nemours & Co., (viii) a material identified by the trademark "APICAL AV" manufactured by Kanegafugi Chemical Industry Company, (ix) a material identified by the trademark "UPILEX" manufactured by UBE Industries, Ltd.; (x) polyethersulfones "PES," manufactured by Sumitomo, (xi) a polyetherimide identified by the trademark "ULTEM" manufactured by General Electric Company, and (xii) polyethylenenaphthalene ("PEN").

The PV roofing tile disclosed herein allows the completed PV roofing tile to be handled and installed in a similar manner to ordinary roofing materials. One fundamental approach is to integrate the laminate onto a composite substrate that can be molded. The placement of the electrical connectors and ability for such connections to be made during the normal course of installation on a roof eliminate the need for electrician involvement. However, it is recognized that regulatory bodies may still require an electrician to be present, however, the time spent by an electrician will be reduced. Furthermore, the inclusion of snap-fit joints that simplify mechanical installation eliminates a need for installation specialists. The advantage in both of these instances is significantly lower installation costs. Also the integration of heat sink assemblies into the roofing tile structure will allow the solar cells to operate at a lower temperature thus increasing the average efficiency and energy generated by the tile. The above described embodiments of a PV tile is much more acceptable to the general consumer, as well as other key stakeholders including builders, general contractors, and architects.

While the invention is described with reference to an exemplary embodiment, it will be understood by those skilled in the art that various changes may be made an equivalence may be substituted for elements thereof without departing from the scope of the invention. In addition, many modifications may be made to the teachings of the invention to adapt to a particular situation without departing from the scope thereof. Therefore, is intended that the invention not be limited the embodiment disclosed for carrying out this invention, but that the invention includes all embodiments falling with the scope of the intended claims. Moreover, the use of the term's first, second, etc. does not denote any order of importance, but rather the term's first, second, etc. are us are used to distinguish one element from another.

What is claimed is:

1. A photovoltaic integrated building component, comprising:
   a polymer substrate;
   a first solar cell laminate assembly and a second solar cell laminate assembly disposed over the polymer substrate, each solar cell laminate assembly including a solar cell assembly, each solar cell assembly having a first side for receiving photons and a second side for producing an electrical current, each solar cell laminate assembly further including a backplane assembly disposed between each solar cell assembly and the polymer substrate, the backplane assembly including a patterned metal layer in electrical contact with the second side of each solar cell assembly; and
   a sealing member operably connected to the first and second solar cell laminate assemblies, the sealing member including an electrical connector in electrical contact with the patterned metal layer of the backplane assembly to provide electrical interconnection between the first and second solar cell laminate assemblies.

2. The component according to claim 1, wherein the sealing member is operably connected to the first and second solar cell laminate assemblies by a snap-fit feature for engaging a snap-fit feature of the first and second solar cell laminate assemblies.

3. The component according to claim 1, wherein the polymer substrate is capable of being directly attached to a rafter of a building structure.

4. The component according to claim 1, wherein the polymer substrate is capable of being directly attached to a batten of a building structure.

5. The component according to claim 1, further comprising an encapsulant for encapsulating each solar cell assembly.

6. The component according to claim 5, further comprising a glass substrate disposed over the encapsulant.

7. The component according to claim 1, wherein the backplane assembly further includes an insulating substrate disposed between the polymer substrate and the metal layer.

8. The component according to claim 1, wherein each solar cell assembly comprises a plurality of silicon wafers.

9. The component according to claim 8, wherein the plurality of silicon wafers are mounted on a polymer flex substrate.

10. The component according to claim 9, wherein electrical current produced by each silicon wafer is transported to an edge connector of the metal layer by an interconnect pattern in a series string.

11. The component according to claim 10, wherein the series string includes a diode for allowing a failed series string to be bypassed.

12. The component according to claim 10, wherein the edge connector includes a conductive extension that extends normal to the polymer substrate along a periphery of the first and second solar cell laminate assemblies.

13. The component according to claim 1, further comprising a plastic frame disposed about a periphery of the first and second solar cell laminate assemblies.

14. The component according to claim 13, further comprising a heat sink assembly in thermal communication with the conductive extension for dissipating heat from the first and second solar cell laminate assemblies.

15. The component according to claim 14, wherein the heat sink assembly is embedded in the plastic frame.

16. The component according to claim 14, wherein the heat sink assembly comprises cooling fins insert molded with the plastic frame.

17. The component according to claim 14, wherein the heat sink assembly comprises a high emissivity layer molded in the plastic frame.

18. The component according to claim 14, wherein the plastic frame includes a keyed channel for facilitating attachment of the component to a batten of a building structure.

19. A photovoltaic integrated building component, comprising:
a polymer substrate;
a first solar cell laminate assembly and a second solar cell laminate assembly disposed over the polymer substrate, each solar cell laminate assembly including a solar cell assembly, each solar cell assembly having a first side for receiving photons and a second side for producing an electrical current, each solar cell laminate assembly further including a backplane assembly disposed between each solar cell assembly and the polymer substrate, the backplane assembly including a patterned metal layer in electrical contact with the second side of each solar cell assembly, each solar cell laminate assembly including a frame disposed about a periphery of each solar cell laminate assembly, a portion of the patterned metal layer extending from the frame defining an edge connector; and
a sealing member operably connected to the first and second solar cell laminate assemblies, the sealing member including an electrical connector in electrical contact with the edge connector extending from the frame of each solar cell laminate assembly to provide electrical interconnection between the first and second solar cell laminate assemblies.

20. The component according to claim 19, further comprising an electrical buswork connected to the male electrical connector for providing a conduit for generated power from each solar cell assembly.

21. The component according to claim 19, wherein each solar cell laminate assembly includes a channel for receiving an O-ring for providing a seal between the sealing member and each solar cell laminate assembly.

22. The component according to claim 19, wherein the first electrical connector comprises a female electrical connector, and wherein the second electrical connector comprises a male electrical connector.

23. The component according to claim 19, further comprising a fastener for biasing the sealing member towards each solar cell laminate assembly to provide a seal therebetween.

24. The component according to claim 19, further comprising an indicating means for providing a visual indication of the electrical interconnection between the first and second solar cell laminate assemblies.

25. The component according to claim 19, wherein a heat sink assembly is embedded in the plastic frame.

26. The component according to claim 25, wherein the heat sink assembly comprises cooling fins insert molded with the plastic frame.

27. The component according to claim 25, wherein the heat sink assembly comprises a high emissivity layer molded in the plastic frame.

28. The component according to claim 19, wherein the plastic frame includes a keyed channel for facilitating attachment of the component to a batten of a building structure.

* * * * *

UNITED STATES PATENT AND TRADEMARK OFFICE
CERTIFICATE OF CORRECTION

PATENT NO.      : 7,642,449 B2
APPLICATION NO. : 10/711107
DATED           : January 5, 2010
INVENTOR(S)     : Korman et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1190 days.

Signed and Sealed this

Twenty-first Day of December, 2010

David J. Kappos
*Director of the United States Patent and Trademark Office*